(12) United States Patent
Kabakchiev et al.

(10) Patent No.: US 10,134,498 B2
(45) Date of Patent: Nov. 20, 2018

(54) PLASMON GENERATOR

(71) Applicants: MAX-PLANCK-GESELLSCHAFT ZUR FÖRDERUNG DER WISSENSCHAFTEN E.V., München (DE); KING'S COLLEGE LONDON, Strand, London (GB)

(72) Inventors: Alexander Kabakchiev, Stuttgart (DE); Theresa Lutz, Mannheim (DE); Christoph Grosse, Stuttgart (DE); Uta Schlickum, Leonberg (DE); Klaus Kuhnke, Stuttgart (DE); Klaus Kern, Waldenbuch (DE); Alessandro De Vita, London (GB)

(73) Assignees: MAX-PLANCK-GESELLSCHAFT ZUR FORDERUNG DER WISSENSCHAFTEN E.V., Munich (DE); KING'S COLLEGE LONDON (GB)

( * ) Notice: Subject to any disclaimer, the term of this patent is extended or adjusted under 35 U.S.C. 154(b) by 0 days.

(21) Appl. No.: 15/101,438

(22) PCT Filed: Nov. 28, 2014

(86) PCT No.: PCT/EP2014/075939
§ 371 (c)(1),
(2) Date: Jun. 3, 2016

(87) PCT Pub. No.: WO2015/082343
PCT Pub. Date: Jun. 11, 2015

(65) Prior Publication Data
US 2016/0314867 A1  Oct. 27, 2016

Related U.S. Application Data

(63) Continuation of application No. PCT/EP2014/055148, filed on Mar. 14, 2014, which
(Continued)

(51) Int. Cl.
H01S 1/00 (2006.01)
G21K 1/08 (2006.01)
(Continued)

(52) U.S. Cl.
CPC ............... G21K 1/08 (2013.01); B82Y 10/00 (2013.01); B82Y 20/00 (2013.01); G02B 5/008 (2013.01);
(Continued)

(58) Field of Classification Search
CPC ...... G21K 1/08; G21K 1/00; G01N 2021/258; G02B 5/008; G02B 5/1809
(Continued)

(56) References Cited

U.S. PATENT DOCUMENTS 7,949,210 B2  5/2011 Durfee et al.
7,960,753 B2  6/2011 Conway et al.
(Continued)

FOREIGN PATENT DOCUMENTS

WO  2010117280 A1  10/2010

OTHER PUBLICATIONS

F. Rossel et al: "Luminescence experiments on supported molecules with the scanning tunneling microscope", Surface Science Reports, vol. 65, No. 5, May 31, 2010.
(Continued)

*Primary Examiner* — Jason McCormack
(74) *Attorney, Agent, or Firm* — Cantor Colburn LLP

(57) ABSTRACT

A plasmon generator comprises a plasmon supporting surface and first and second quantum systems respectively
(Continued)

Figure 1:
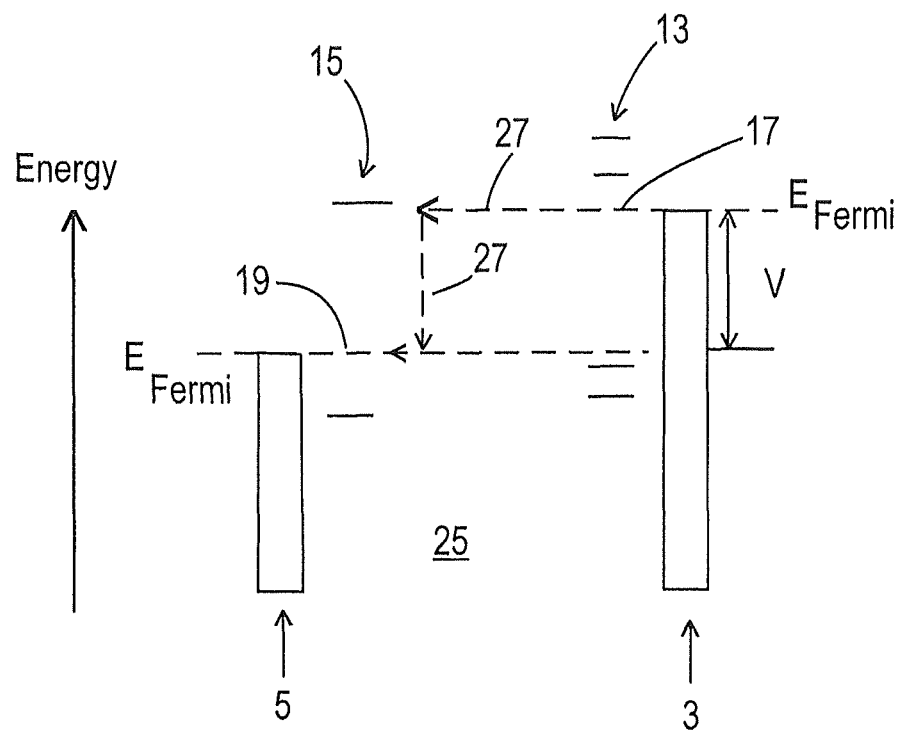

defining first and second quantum states with a tunneling junction being present between the first and second quantum systems, the first and second quantum systems being present in an electric circuit to generate a tunneling current between the first and second quantum systems, whereby electrons tunneling between said first and second quantum states loose energy in the process and generate plasmons at the plasmon supporting surface.

24 Claims, 6 Drawing Sheets

Related U.S. Application Data is a continuation-in-part of application No. PCT/EP2013/075435, filed on Dec. 3, 2013.

(51) Int. Cl.
*B82Y 10/00* (2011.01)
*B82Y 20/00* (2011.01)
*G02B 5/00* (2006.01)
*G02B 6/122* (2006.01)
*H01L 33/04* (2010.01)
*H01L 33/00* (2010.01)

(52) U.S. Cl.
CPC ........ *G02B 6/1226* (2013.01); *H01L 33/0041* (2013.01); *H01L 33/04* (2013.01)

(58) Field of Classification Search
USPC ........................................................ 250/251
See application file for complete search history.

(56) References Cited

U.S. PATENT DOCUMENTS

| 8,139,906 | B2 | 3/2012 | Lee et al. |
| 2003/0206708 | A1 | 11/2003 | Estes et al. |
| 2005/0104684 | A1* | 5/2005 | Wojcik ............... B82Y 20/00 333/108 |
| 2007/0223940 | A1* | 9/2007 | Smolyaninov ......... B82Y 20/00 398/214 |
| 2012/0080087 | A1* | 4/2012 | Denby ............ H01L 31/035281 136/256 |
| 2012/0153254 | A1 | 6/2012 | Mastro |
| 2012/0298190 | A1 | 11/2012 | Dutta |

OTHER PUBLICATIONS

Jonathan A. Scholl et al: "Observation of Quantum Tunneling between Two Plasmonic Nanoparticles", Nano Letters, vol. 13, No. 2, Feb. 13, 2013.
M. S. Tame et al.: "Quantum plasmonics", Nature Physics, vol. 9, No. 6, Jun. 3, 2013.

* cited by examiner

PLASMON GENERATOR

CROSS-REFERENCES TO RELATED APPLICATIONS

This patent application is a 371 of International Application No. PCT/EP2014/075939, filed Nov. 28, 2014 which is a continuation of International Application No. PCT/EP2014/055148, filed Mar. 14, 2014 which is a continuation in part of International Application No. PCT/EP2013/075435, filed Dec. 3, 2013, each of which are incorporated herein by reference in their entirety.

The present invention relates to a plasmon generator for generating plasmons at a plasmon supporting surface.

Plasmonics is based on the excitation and propagation of surface plasmons, or more formally surface plasmon polaritons, which are electromagnetic waves similar to light waves but confined to a surface region of a conductor. Plasmonic devices are being developed for novel light-based information processors and for communication lines between electronic circuits or parts of electronic circuits. Plasmons allow for a much higher energy density and a much higher spatial confinement and localization than conventional optics. For example, wires of only tens to hundred nanometer size allow the transport of plasmons which may serve as information carriers.

U.S. Pat. No. 7,949,210 B2 deals with integrating plasmon optical elements and silicon devices on a single chip. This document describes various ways of manipulating propagating plasmons and converting plasmons into photons. Such devices can be used with the present plasmon generator if desired.

U.S. Pat. No. 7,960,753 B2 deals with the detection of plasmons in a plasmon actuated transistor and forms some counterpart (receiver) of the described plasmon generator with respect to information transfer between two points on a chip.

It is an object of the present invention to provide a device which allows for an efficient generation of surface plasmons.

The object is satisfied by a plasmon generator in accordance with any one of the independent claims. Preferred embodiments of the invention are described in the dependent claims.

A plasmon generator in accordance with a first variant of the present invention has a plasmon supporting surface and first and second quantum systems respectively defining first and second quantum states with a tunneling junction being present between the first and second quantum systems, the first and second quantum systems being present in an electric circuit to generate a tunneling current between the first and second quantum systems, whereby electrons tunneling between said first and second quantum states loose energy in the process and generate plasmons at the plasmon supporting surface.

A novel type of plasmon generator is therefore made available which can readily be realized as a solid state component on an electronic chip and can be used to couple different parts of an electric circuit or different electric circuits. The coupling is extremely fast due to high transport speed and can be effected by a very thin plasmon guiding surface, for example the surface of an electrode with a thickness in the nanometer range, much thinner than an optical fiber.

The plasmon generator also offers the opportunity to miniaturize the interface between an electric circuit and a plasmon wave guide to dimensions of the size of the quantum system and tunnel junction. It therefore becomes even possible to realize photonic circuits sized below the diffraction limit of photons which makes it possible for photonic circuits based on plasmons to be made in smaller sizes compatible with and comparable to microprocessor electronics.

The new design also provides the basis for a whole series of novel products such as detectors and tunable frequency light sources and also lends itself to frequency multiplexing of plasmon signals from a plurality of plasmon generators in which the frequency of each generator can be dynamically changed and is not fixed by the material properties of the quantum systems themselves.

The plasmons generated by the plasmon generator are preferably surface plasmon polaritons. The surface plasmon polaritons can be trapped at or guided along the plasmon supporting surface and can have frequencies in the visible or infrared regime.

In an advantageous embodiment of the invention, there is at least one electric contact to at least one of the first and second quantum systems. The electric contact is advantageous as it provides a coupling between the respective quantum system and the electric circuit via the tunneling junction.

The plasmon supporting surface can be positioned proximate to at least one of the first quantum system, the second quantum system, and the tunneling junction. The plasmons can therefore be effectively generated at the plasmon supporting surface due to the proximity of the surface to the respective quantum system and/or the tunneling junction.

In an advantageous embodiment of the invention, there are first and second electrodes respectively associated with said first and second quantum systems and forming part of said current circuit. The first and second quantum systems can be placed in between the two electrodes in efficient electric tunneling contact to the electrodes. As the first electrode is associated with the first quantum system, the first quantum system is preferably placed proximate to the first electrode enabling electrons to tunnel between the first quantum system and the first electrode. Correspondingly, the second electrode is associated with the second quantum system which is preferably placed proximate to the second electrode enabling electrons to tunnel between the second quantum system and the second electrode. The distance between the respective quantum system and the associated electrode is preferably in the nanometer range, further preferably between 0.1 and 5 nm and especially between 0.5 and 2 nanometers. These tunnel contacts define a preferably more efficient (lower resistance) tunnel junction than the tunnel junction between the first and the second quantum system.

In a preferred embodiment of the present invention, at least one of the first and second electrodes defines the plasmon supporting surface. The plasmons can therefore be generated effectively on at least one of the electrodes and transported to a point of use, such as another electric circuit on the same chip, another part of an electric circuit on the same chip, another electric circuit on a different chip, or a device for converting the plasmons to photons, by simply extending the electrode or electrodes to the point of use. Both electrodes can be readily used for the transport of the plasmons, which is indeed highly efficient if the electrodes extend parallel to one another with a dielectric between them.

In an advantageous embodiment of the present invention, the first and the second electrodes define a plasmon supporting waveguide. The plasmons can be guided over longer distances by use of the waveguide which can also facilitate the implementation of the plasmon generator in photonic circuits.

The or each quantum system can be any physical system with prominent electronic states having at least substantially discrete energy levels such as an atom, a molecule, a quantum dot, a quantum wire, a nanotube or any semiconducting structure with an appropriate arrangement of electronic states. The term "at least substantially discrete energy levels" as used herein refers to discrete or substantially discrete energy levels which are typically present in atoms or molecules or to any other electronic state density which is highly modulated near the Fermi energy which is for example typical for nanowires. A preferred semiconductor layer may be realized by a layer of $C_{60}$-molecules. There are therefore many different ways of implementing the quantum systems and the specific advantages of different types of quantum systems can be exploited for specific fields of use of the plasmon generator, so that a diverse variety of potential applications exists.

In accordance with a preferred embodiment of the invention, there are a plurality of first quantum systems and a plurality of second systems and a plurality of tunnel junctions in said electric circuit. The intensity of the generated plasmons can be enhanced as electrons can tunnel in parallel through the respective tunnel junctions in parallel and thereby generate surface plasmon polaritons at the plasmon supporting surface.

At least one of the first and second quantum systems can have a plurality of at least substantially discrete quantum states. This provides the advantage that at least one of the quantum states is close to the Fermi level of an associated electrode. The ability to move the Fermi level via the applied voltage or field provides the possibility of threshold selection, e.g. a threshold which can be moved as a switching mechanism to switch tunneling on and off.

In an advantageous embodiment of the present invention, at least one of the quantum states has an energy close to the Fermi level of an associated electrode whereby the potential applied to the electrode changes the Fermi level and the energy level of the quantum state and thus the energy difference between the first and second quantum states. The plasmon generator is therefore tunable by the potential difference applied by the circuit and different emission frequencies are possible and also different colors of light photons can be generated from the plasmons.

In an advantageous embodiment, the plasmon generator comprises a modifier for modifying the tunneling current by changing the energy level of the quantum state.

Due to a change of the energy level of at least one quantum state, the tunneling current can therefore be changed which may cause a change of the intensity and/or the color of the generated plasmons.

Preferably, the modifier comprises at least one of an electric field generator, a magnetic field generator, a third quantum system associated with an electrode disposed proximate to one of the first and second quantum systems, and an external source of radiation or particles causing an electric or magnetic field at the location of the first or second quantum systems and/or ionization.

Preferably, the modifier comprises a third quantum system disposed proximate to one of the first and second quantum systems and an electric field generator, in particular a gate electrode, to modify the energy level of a third quantum state defined by the third quantum system such that the modified quantum state can be electrically charged due to an interaction with the electrode associated with the respective one of the first and second quantum systems.

The modifier enables the intensity of the generated plasmons to be changed, since the modifier can modify the tunneling current by changing the energy level of the first quantum state of the first quantum system. In particular, the energy level can be changed by use of an electric or magnetic field being present at the location of the first quantum system. Such an electric or magnetic field can be generated by use of any kind of electric or magnetic field generator.

Furthermore, an electric field at the location of the first quantum system can also be generated by use of an electrically charged third quantum system placed in the proximity of the first quantum system and its associated first electrode. The third quantum system can be charged by use of a separate electrode, a so-called gate electrode, which is placed proximate to the third electrode and which can generate an electric field at the position of the third quantum system.

The third quantum system is preferably selected in such a way that it provides a third quantum state having an energy level close to the Fermi energy of the first electrode. Due to the electric field, the energy level of the third quantum state can be changed in such a way that an electron can be transferred from the first electrode to the third quantum state and thereby charging up the third quantum system. Alternative, it could be that an electron is transferred from the third quantum system to the electrode leaving a hole at the third quantum system and thereby also a charge up of the third quantum system takes place. Thus, a gate electrode can be employed to change the charge state of a third quantum system which generates, in dependence on its charge state, an electric field at the location of the first quantum system and thereby changes the energy level of the first quantum state and hence the tunneling current. Due to proximity of the third quantum system to the first or second quantum systems the transfer of a single elementary charge to the third quantum system will be sufficient to change the generated plasmons in a way that can be employed for a transmission of binary information.

Instead of a gate electrode, the electric field at the location of the third quantum system could also be generated by another kind of electric field generator. Furthermore, an external source of radiation or particles, e.g. from an alpha or beta decay, can cause a charging up of the third quantum system and thereby modify the tunneling current which can be measured in form of a change in the intensity of the generated plasmons. Thus, embodiments of the plasmon generator in accordance with the present invention can be employed as detectors for the detection of an external source of radiation or particles.

In accordance with a second variant of the present invention there is provided a plasmon generator having a plasmon supporting surface, and a quantum system defining at least one quantum state, the quantum system and an electric contact being present in an electric circuit with a tunneling junction being present between the quantum system and the contact for generating a tunneling current between the quantum system and the contact, whereby electrons tunneling between said contact and said quantum state loose energy in the process and generate plasmons at the plasmon supporting surface, there being a modifier for modifying the tunneling current by changing the energy level of the quantum state.

Thus, another novel type of plasmon generator is made available which can readily be realized as a solid state component on an electronic chip and can be used to couple different parts of an electric circuit provided on the same chip, or different electric circuits provided on the same chip, or different electric circuits provided on separate chips, or a device for converting the plasmons to photons, by simply extending the electrode or electrodes to the point of use. The coupling is extremely fast due to high transport speed and can be effected by a very thin plasmon guiding surface, for example the surface of an electrode with a thickness in the nanometer range, much thinner than an optical fiber. The plasmon generator offers the opportunity to miniaturize the interface between an electric circuit and a plasmon wave guide to dimensions of the size of the quantum system and tunnel junction. The new design also provides the basis for a whole series of novel products such as detectors and tunable frequency light sources and also lends itself to frequency multiplexing of plasmon signals from a plurality of plasmon generators in which the frequency of each generator can be dynamically changed and is not fixed by the material properties of the quantum systems themselves. Furthermore, the modifier enables the intensity of the generated plasmons to be adjusted in a simple and efficient way.

It is preferred that the plasmon supporting surface is positioned proximate to at least one of the contact, the quantum system, and the tunneling junction. The plasmons can therefore be generated effectively and efficiently at the plasmon supporting surface.

In an advantageous embodiment of the present invention, the plasmon generator comprises a first electrode associated with the quantum system and forming part of said current circuit. The first electrode could be placed proximate to the quantum system in such a way that electrons can tunnel between the quantum system and the first electrode. The distance between the first electrode and the quantum system can for example be in the nanometer range, preferably in the range between 0.1 and 5 nm, especially between 0.5 and 2 nanometers. This tunnel contact forms a preferably more efficient (lower resistance) tunnel junction than the one between quantum system and electric contact.

In an advantageous embodiment of the present invention, the electric contact is defined by one of a second quantum system defining at least a second quantum state, a second electrode, and a combination of the second quantum system and the second electrode. In particular, electrons may tunnel between a first quantum state of the first quantum system and the second quantum state of the second quantum system and thereby loosing energy in the tunneling process and generate plasmons at the plasmon supporting surface.

The energy level of the second quantum state can be changed, for example by changing the Fermi energy of the associated second electrode via a voltage applied across the second electrode and a first electrode associated with the first quantum system. Furthermore, the energy level of the first quantum state can also be changed by a change of the Fermi energy of the first electrode via a change of the applied voltage. As a result, the energy difference between the first quantum state and the second quantum state is changeable by changing the applied voltage. The energy difference between the first and second quantum states corresponds to the energy which is lost by an electron tunneling between the first and second quantum systems and thus to the energy of the generated plasmon. The electronic contact defined by a second quantum system having at least a second quantum state and an associated second electrode is therefore advantageous as the energy and thus the frequency of the generated plasmons can be tuned by changing the voltage applied across the first and second electrodes.

In a preferred embodiment of the present invention, at least one of the first and second electrodes defines the plasmon supporting surface. The plasmons can therefore be generated effectively on at least one of the electrodes and transported to a point of use, such as another electric circuit on the same chip or a device for converting the plasmons to photons, by simply extending the electrode or electrodes to the point of use. Both electrodes can be readily used for the transport of the plasmons, which is indeed highly efficient if the electrodes extend parallel to one another with a dielectric between them.

Preferably, the first and second electrodes define a plasmon supporting waveguide. The transport of the generated plasmons can therefore be further improved, as the waveguide can guide the generated plasmons with little loss to a point of use.

In an advantageous embodiment of the present invention, the quantum state of the first quantum system has an energy close to the Fermi level of an associated electrode whereby the potential applied to the electrode changes the Fermi level and the energy level of the quantum state of the first quantum system and thus the energy difference between the quantum state of the first quantum system and an energy level provided by the contact. The plasmon generator becomes tunable and different emission frequencies are possible and also different colors of visible light (photons) generated by the plasmons.

The modifier can be user-controllable. The user is therefore able to vary the level of the intensity of the generated plasmons.

In accordance with an advantageous embodiment of the present invention, the modifier comprises at least one of an electric field generator, a magnetic field generator, a third quantum system associated with an electrode disposed proximate to the first quantum system, and an external source of radiation or particles causing an electric or magnetic field at the location of the first or third quantum system and/or ionization.

Preferably, the modifier comprises a third quantum system disposed proximate to one of the first and second quantum systems and an electric field generator, in particular a gate electrode, to modify the energy level of a third quantum state defined by the third quantum system such that the modified quantum state can be electrically charged due to an interaction with the electrode associated with the respective one of the first and second quantum systems.

The modifier enables the intensity of the generated plasmons to be changed, since the modifier can modify the tunneling current by changing the energy level of the first quantum state of the first quantum system. In particular, the energy level can be changed by use of an electric or magnetic field being present at the location of the first quantum system. Such an electric or magnetic field can be generated by use of any kind of electric or magnetic field generators.

Furthermore, an electric field at the location of the first quantum system can also be generated by use of an electrically charged third quantum system placed in the proximity of the first quantum system and its associated first electrode. The third quantum system can be charged by use of a separate electrode, a so-called gate electrode, which is placed proximate to the third electrode and which can generate an electric field at the position of the third quantum system.

The third quantum system is preferably selected in such a way that it provides a third quantum state having an energy level close the Fermi energy of the first electrode. Due to the electric field, the energy level of the third quantum state can be changed in such a way that an electron can be transferred from the first electrode to the third quantum state and thereby charging up the third quantum system. Alternatively, an electron could be transferred from the third quantum system to the electrode leaving a hole at the third quantum system and thereby also charge up the third quantum system. Thus, a gate electrode can be employed to change the state of charge of a third quantum system which generates, in dependence on its state of charge, an electric field at the location of the first quantum system and thereby changes the energy level of the first quantum state and hence the tunneling current. Due to proximity of the third quantum system to the first quantum systems the transfer of a single elementary charge to the third quantum system will be sufficient to change the generated plasmons in a way that can be employed for a transmission of binary information.

Instead of a gate electrode, the electric field at the location of the third quantum system could also be generated by another kind of electric field generator. Furthermore, an external source of radiation or particles, e.g. from an alpha or beta decay, can cause a charging up of the third quantum system and thereby modify the tunneling current which can be measured in form of a change in the intensity of the generated plasmons. Thus, embodiments of the plasmon generator in accordance with the present invention can be employed as detectors for the detection of an external source of radiation or particles.

Preferably, the or each quantum system is any physical system with prominent electronic states having at least substantially discrete energy levels such as an atom, a molecule, a quantum dot, a quantum wire, a nanotube or any semiconducting structure with an appropriate arrangement of electronic states. The term "at least substantially discrete energy levels" refers in particular to discrete energy levels which are typically present in atoms or molecules or to any other electronic state density which is highly modulated near the Fermi energy which is for example typical for nanowires. A preferred semiconductor layer may be realized by a layer of $C_{60}$-molecules. There are therefore many different ways of implementing the discrete quantum systems and the specific advantages of different types of quantum systems can be exploited for specific fields of use of the plasmon generator, so that a diverse variety of potential applications exists.

Figure 2:
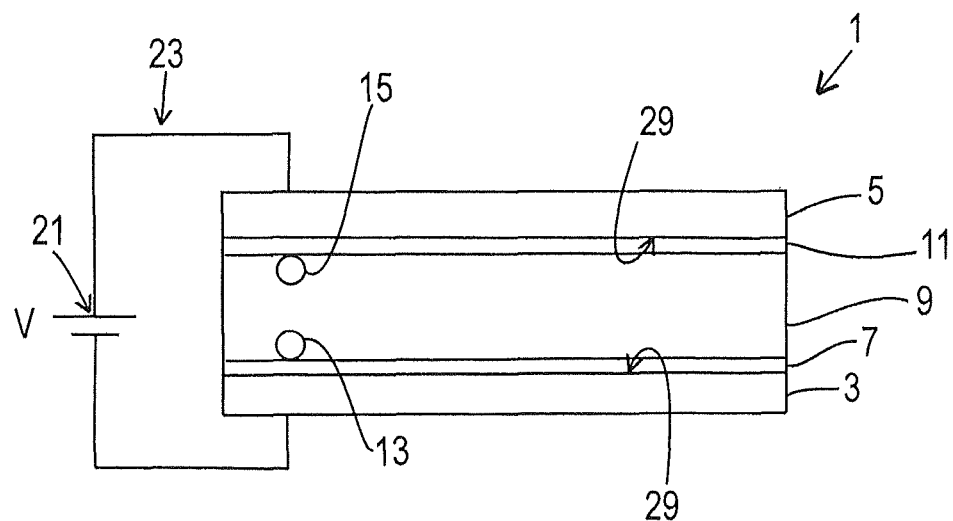
Figure 3:
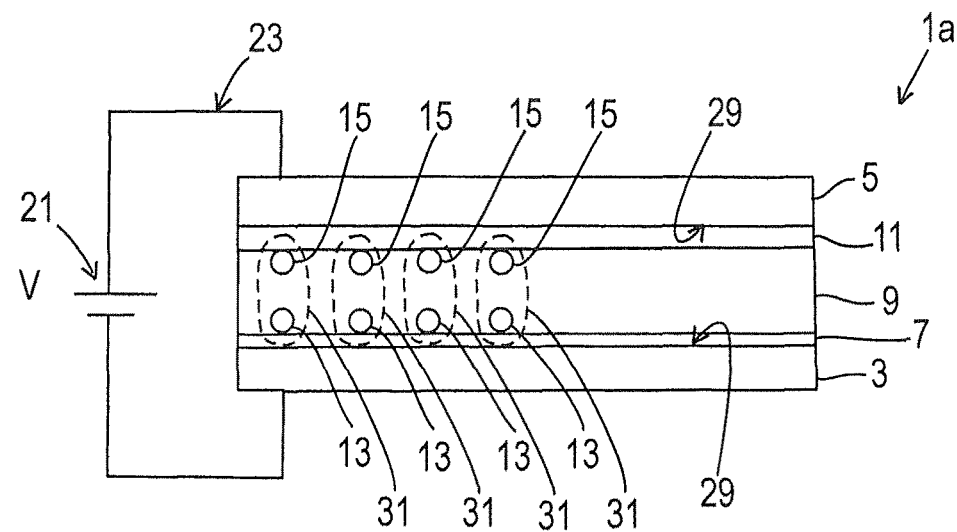
Figure 4:
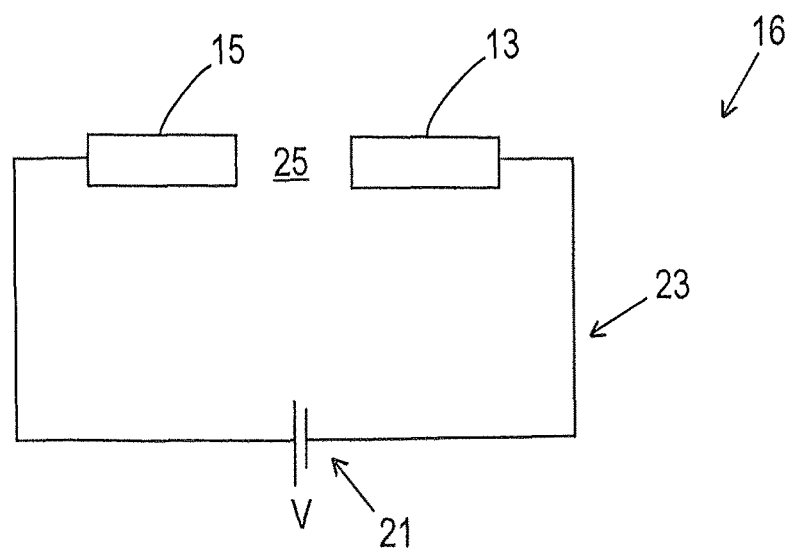
Figure 5:
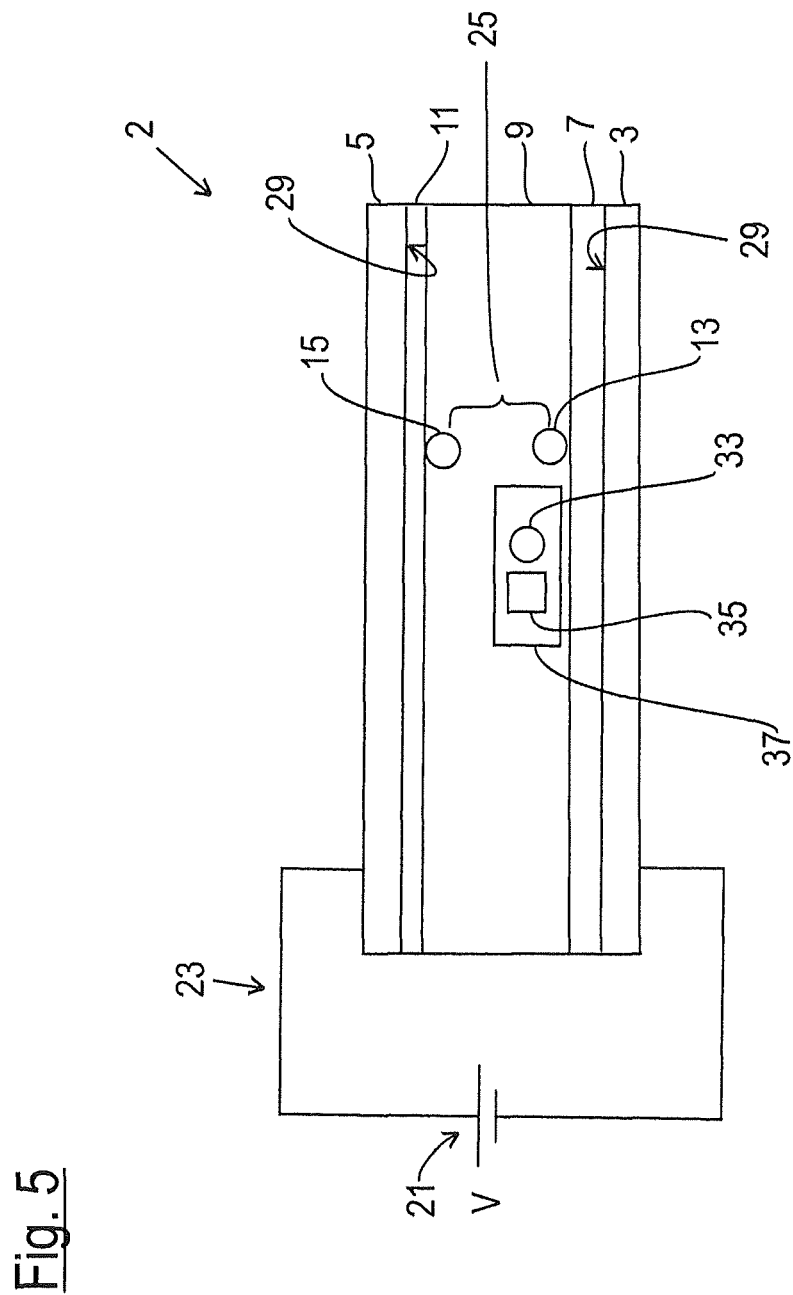
Figure 6:
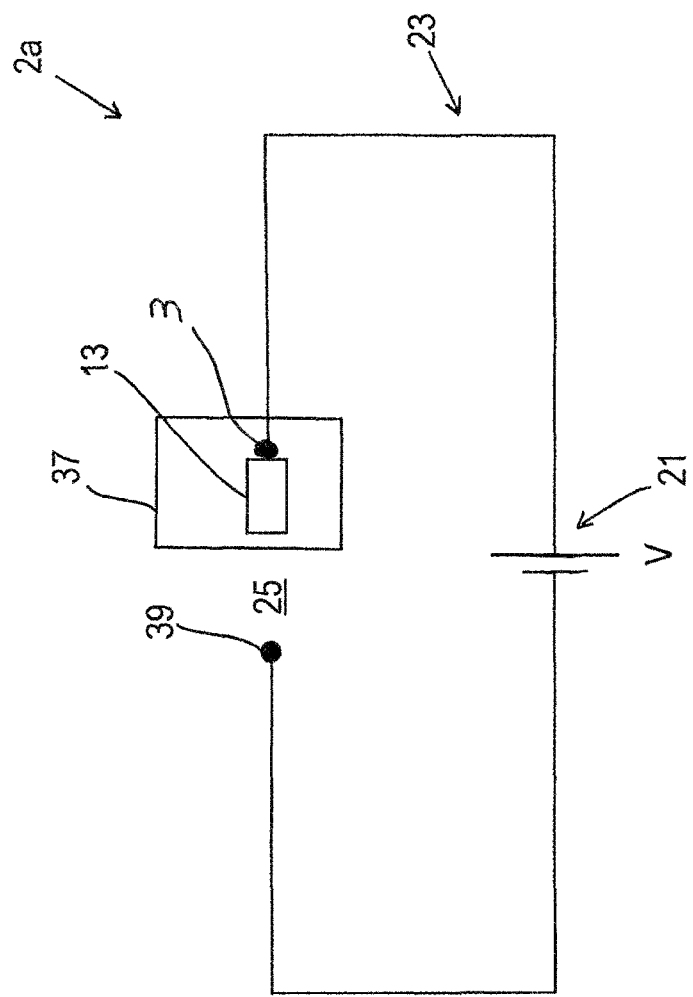
Figure 7:
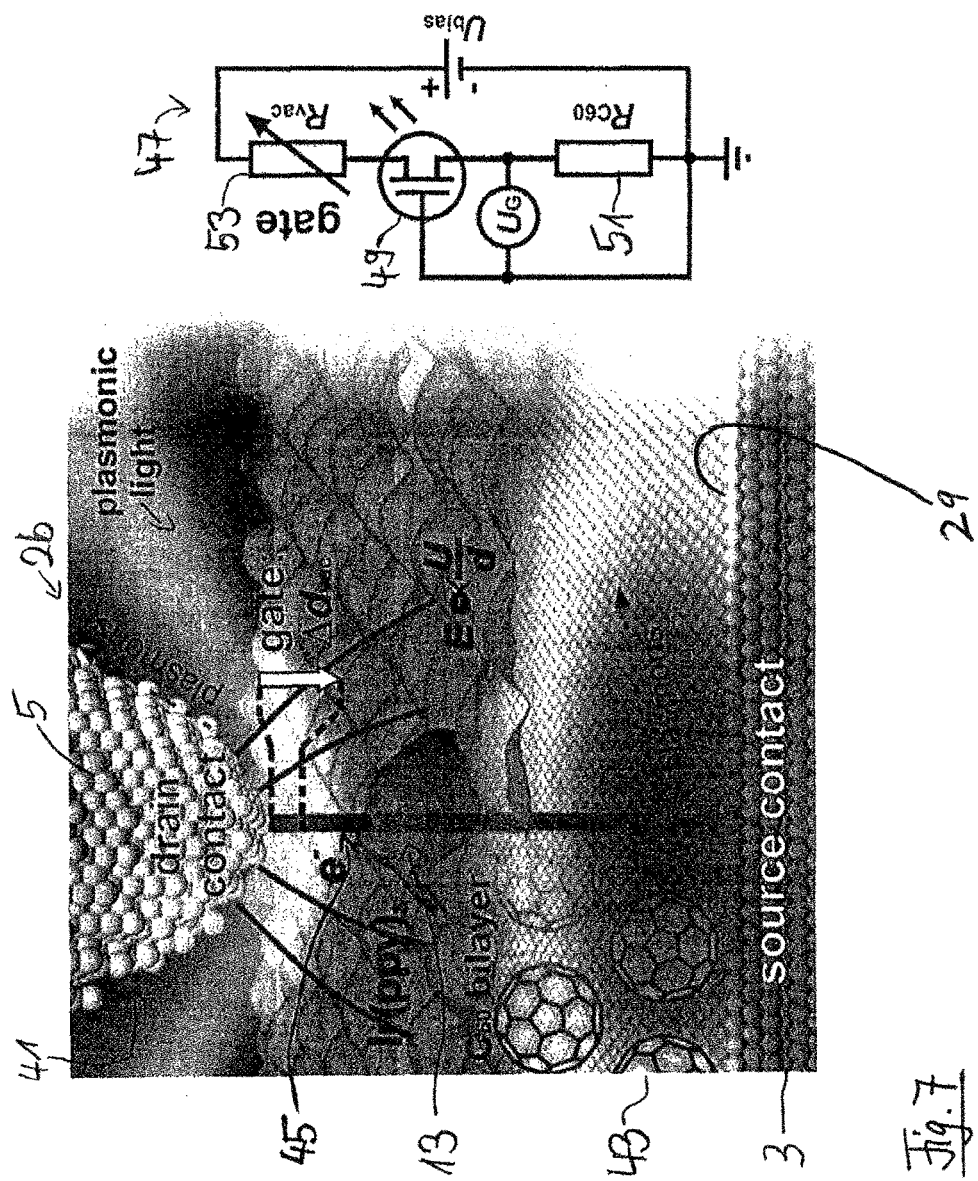
Figure 8:
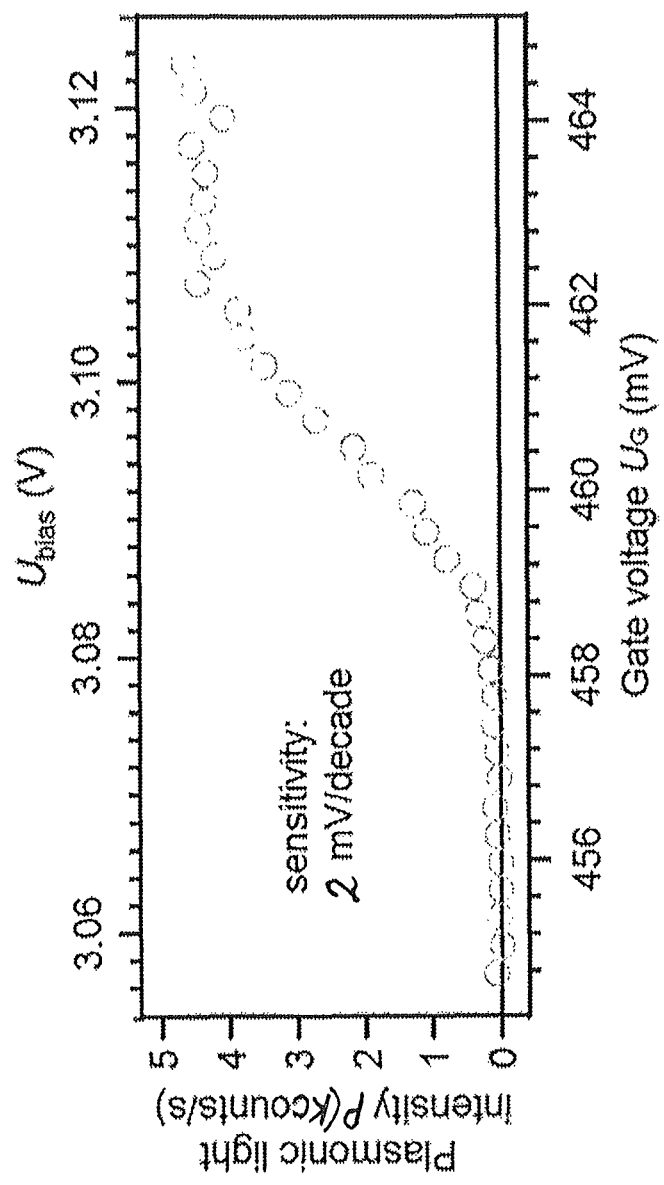

The invention will be described in detail in the following with reference to embodiments shown in the accompanying drawings and by way of example only. In the drawings there are shown:

FIG. 1 a schematic energy diagram and plasmon generating mechanism of a first embodiment of a plasmon generator in accordance with the present invention, FIG. 2 a schematic cross sectional view of the first embodiment of the plasmon generator in accordance with the present invention, FIG. 3 a schematic cross sectional view of a second embodiment of a plasmon generator in accordance with the present invention, FIG. 4 a schematic view of a third embodiment of a plasmon generator in accordance with the present invention, FIG. 5 a schematic cross sectional view of a fourth embodiment of the plasmon generator in accordance with the present invention, FIG. 6 a schematic view of a fifth embodiment of a plasmon generator in accordance with the present invention, FIG. 7 a schematic view of a sixth embodiment of a plasmon generator in accordance with the present invention, and FIG. 8 a graph showing plasmonic light intensity in kcounts/s=1000 counts/s as a function of the gate voltage $U_G$ and of the bias voltage $U_{bias}$ for the embodiment of FIG. 7.

With regard to FIGS. 1 and 2, a first embodiment of a plasmon generator 1 is described. The plasmon generator 1 comprises a first electrode 3 and a second electrode 5. Each of the electrodes 3, 5 consists of at least one layer of a conducting material such as gold or silver. First, second and third insulating layers 7, 9 and 11 are sandwiched between the first and second electrodes 3, 5. Insulating layer 9 consists of at least one layer of an insulating material as an oxide layer, in particular silicium oxide, or alkalihalide layer, in particular a KCl-layer, or can be an evacuated gap (vacuum junction). The insulating layers 7 and 11 consist of an insulator or a semiconductor e.g. of $C_{60}$ molecules (bucky balls). The insulating layers 7 and 11 can be regarded as buffer layers.

There may also be more layers than the first, second and third insulating layers 7, 9, 11 sandwiched between the first and second electrodes 3, 5. Moreover, there may also be fewer layers present between the two electrodes 3, 5. For example, the first insulating layer 7 and the third insulating layer 11 can be omitted if specific quantum systems are used which exhibit an inherent insulating property towards their substrate, e.g. so called double decker molecules (naphtalenediimide cyclophane). The different insulating layers 7, 9 and 11 may consist of identical or different insulating materials.

A first quantum system 13 is placed into the second insulating layer 9 in such a way that the first quantum system 13 is proximate to the first electrode 3. The first quantum system 13 is chosen such that it provides at least a first quantum state 17 with an energy level close to the Fermi energy ($E_{Fermi}$) of the first electrode 3.

A second quantum system 15 is also placed into the second insulating layer 9 so that it is proximate to the second electrode 5. The second quantum system 15 is also chosen such that it provides at least a second quantum state 19 with an energy level close to the Fermi energy of the second electrode 5. The quantum states 17, 19 are shown as lines in the schematic energy diagram of FIG. 1 at their respective energy levels.

The first and second quantum systems 17, 19 are preferably not completely embedded in the insulating layer 9. Instead, they can be positioned at the surface of the insulating layer 9 so that they face the respective buffer layer 7, 11 as shown in FIG. 2.

It has been found that organic molecules with extended electron systems such as $Ir(ppy)_3$ (fac-tris(2-phenylpyridine) iridium(III)) can be used as suitable quantum systems in conjunction with gold and silver electrodes, since these molecules provide at least one quantum state with an energy level close to the Fermi energy of both gold and silver electrodes. However, any physical system with prominent electronic states having discrete energy levels or any other electronic state density which is modulated near the Fermi energy of the associated conductor may be used as a quantum system. Examples of such physical systems are atoms, molecules, quantum dots, quantum wires, nanotubes or other semiconducting structures with an appropriate arrangement of electronic states. In the simplest form just one molecule or atom can be used for each of the quantum systems, as schematically shown in FIG. 2.

The plasmon generator 1 further comprises an electric circuit 23 having a voltage source 21 which is electrically connected to the first and second electrodes 3, 5.

The dimensions of the electrodes 3, 5 and insulating layers 7, 9, 11 are such that a tunneling current can flow between the first and second electrodes 3, 5 when a voltage V provided by the voltage source 21 is applied to the two electrodes 3, 5.

The process of plasmon generation is based on a tunneling current between the first and second quantum systems 13, 15 which are present in the electric circuit 23. Tunneling further occurs between the first electrode 3 and the first quantum system 13 and the second quantum system 15 and the second electrode 5, so that there is as a result a tunneling current between the two electrodes 3, 5 which closes the electric circuit 23.

The voltage V provided by the voltage source 21 causes a corresponding energy difference between the respective Fermi energy ($E_{Fermi}$) of the first electrode 3 and the respective Fermi energy ($E_{Fermi}$) of the second electrode 5 as shown in FIG. 1. As mentioned before, the energy level of the first quantum state 17 of the first quantum system 13 is close to the respective Fermi energy of the first electrode 3. For example, the energy difference between the energy level of the first quantum state 17 and the respective Fermi energy of the first electrode 3 can be less than 1 electron Volt (<1 eV). Due to a coupling between the first electrode 3 and the first quantum state 17, the energy level of the first quantum state 17 shifts in the same way as the Fermi energy of the first electrode 3 shifts due to the applied voltage V. Correspondingly, the energy level of the second quantum state 19 is close to the Fermi energy of the second electrode 5, e.g. with a difference of less than 1 eV, and shifts in the same way as the Fermi energy of the second electrode 5 shifts due to the supplied voltage.

Thus, as shown in FIG. 1, the voltage V applied between the first and second electrodes 3, 5 causes an energy difference between the energy levels of the first and second quantum states 17, 19 which corresponds at least approximately to the applied voltage V. An electron tunneling through a tunneling junction 25 between the first and second quantum states 17, 19 as indicated in FIG. 1 by the broken line 27 will therefore loose energy and thereby generate a surface plasmon polariton at the opposing surfaces 29 of the electrodes 3, 5 which can act as a plasmon supporting surface and also as a waveguide for the generated surface plasmon polariton which is hereinafter denoted as plasmon.

The plasmon may alternatively be generated at a plasmon supporting surface which is not associated with one of the electrodes 3, 5. For example, a separate gold wire may be provided proximate to the tunneling junction 25 such that a plasmon can be generated based on the described tunneling process on its surface.

The generated plasmon will have an energy which corresponds to the energy lost by the tunneling electron. The energy of the plasmon therefore depends on the applied voltage. Consequently, by changing the voltage V, the energy and thus the frequency of the generated plasmons can be changed. The plasmon generator 1 is therefore tunable with regard to the frequencies of the generated plasmons.

A second embodiment of a plasmon generator 1a is described with regard to FIG. 3. The plasmon generator 1a differs from the plasmon generator 1 as described with regard to FIGS. 1 and 2 in that the plasmon generator 1a comprises a plurality of first quantum systems 13 and a plurality of second quantum systems 15. The first and second quantum systems 13, 15 are arranged in pairs 31 as indicated in FIG. 3 by the dashed ovals. Each pair 31 comprises one first quantum system 13 and one second quantum system 15 which are generally opposite to each other in such a way that a tunnel junction can be established between neighbouring first and second quantum systems 13, 15 of each pair 31.

With regard to each pair 31, the plasmon generating mechanism is the same as explained above with regard to the plasmon generator 1. Since the plasmon generator 1a comprises a plurality of pairs 31 of first and second quantum systems 13, 15, electrons can tunnel in parallel through the respective tunnel junctions formed between the individual pairs 31. The pairs do not have to match exactly one-to-one. Dispersed layers of first quantum systems 13 and second quantum systems 15 will provide stochastically formed pairs which will provide proper operation. Perfectly matched pair positions and layers with increased density of first quantum systems 13 and/or increased density of second quantum systems 15, will increase the performance.

Thus, plasmons can be generated in parallel by the plurality of first and second quantum systems 13, 15 thereby increasing the intensity of the plasmons traveling along the waveguide structure formed by the plasmon supporting surfaces 29 of the first and second electrodes 3, 5.

As explained above, the plasmon generator 1a is tunable with regard to the frequency of the generated plasmons by change of the voltage V applied to the first and second electrodes 3, 5.

A third embodiment of a plasmon generator 1b is described with regard to FIG. 4. The plasmon generator 1b differs from the plasmon generator 1 of FIGS. 1 and 2 in that the plasmon generator 1b does not comprise separate first and second electrodes 3, 5. Instead, the first and second quantum systems 13, 15 of the plasmon generator 1b are coupled directly to the voltage source 21. A typical material used as first and second quantum systems 13, 15 in the plasmon generator 1b could be a quantum wire or a nanotube as such materials can be wired directly to the voltage source 21. Thus, the electric circuit 23 provides an electric contact between the voltage source 21 and the two quantum systems 13, 15.

The plasmon generation mechanism in the plasmon generator 1b is essentially the same as explained above with regard to FIGS. 1 and 2. In the plasmon generator 1b, the first and second quantum systems 13, 15 are present in the electric circuit 23 and provide first and second quantum states (see the quantum states 17, 19 in FIG. 1) to generate a tunneling current through a tunnel junction 25 between the first and second quantum states, whereby electrons tunneling between said first and second quantum states loose energy and generate plasmons at a plasmon supporting surface (not shown in FIG. 4) positioned proximate to the tunneling junction 25.

In the case of extended quantum systems, e.g. quantum wires and carbon nanotubes the Fermi energy is established at the respective junction between the quantum systems 13 and 15 and the circuit 23.

A fifth embodiment of a plasmon generator 2 is described with regard to FIG. 5. The plasmon generator 2 comprises first and second electrodes 3, 5 with insulating layers 7, 9 and 11 sandwiched in between the electrodes 3, 5. Furthermore, an electric circuit 23 is provided which includes a voltage source 21 and the first and second electrodes 3, 5, with first and second quantum systems 13, 15 being present in the electric circuit 23.

The plasmon generating process in the plasmon generator 2 corresponds to the respective plasmon generating process described above with regard to the plasmon generator 1. Thus, the first and second quantum systems 13, 15 provide first and second quantum states (see reference numerals 17, 19 in FIG. 1) with a tunneling junction 25 being present between the first and second quantum systems 13, 15 through which a tunneling current can flow. Electrons tunneling between the first and second quantum states of the first and second quantum systems 13, 15 loose energy in the tunneling process which is dependent on the voltage V applied to the first and second electrodes 3, 5 and thereby generate plasmons at the plasmon supporting surfaces 29 provided by the first and second electrodes 3, 5.

The plasmon generator 2 further comprises a third quantum system 33 providing at least a third quantum state and a so-called gate electrode 35. The third quantum system 33 and the gate electrode 35 belong to a modifier 37 which is employed in the plasmon generator 2 for modifying the tunneling current between the first and second quantum systems 13, 15 by changing the energy level of the first quantum state of the first quantum system 13.

In contrast to the first quantum system 13, the third quantum system 33 is not strongly coupled to the first electrode 3, but the third quantum system 33 is proximate to the first quantum system 13. For example, as shown in FIG. 5, it can be placed in the same insulating layer 9 as the first quantum system 13.

The third quantum system 33 is further arranged proximate to the gate electrode 35 which is adapted to provide an electric field at the location of the third quantum system 33 which is sufficiently strong to modify a third quantum state provided by the third quantum system 33 in such a way that an electron from the first electrode 3 will tunnel from the first electrode 3 to the third quantum state. The electric field can be small when the charged third quantum state is energetically close to the Fermi energy of the first electrode 3 from which the transferred charge originates.

As a result, the third quantum system 33 will be negatively charged due to the additional electron provided by the first electrode 3. Depending on the third quantum state and on the polarization of the voltage V, it could alternatively be the case that an electron from the third quantum state tunnels to the first electrode 3 leaving a hole at the third quantum system 33 which is then positively charged.

In either way, the charged third quantum system 33 affects, in particular through Coulomb interaction, the energy level of the first quantum state of the first quantum system 13 which will further affect the tunnel current between the first quantum system 13 and the second quantum system 15. As a result, the intensity of the plasmons generated at the plasmon support surfaces 29 changes in dependence on the state of charge of the third quantum system 33 which can be changed—as explained above—by the electric field provided by the gate electrode 35.

This can, for example, be exploited to transfer information from the charging process of the third quantum system 33 via the generated plasmons to a distant plasmon receiver or light detector. In this regard, the plasmon generator 2 can be employed, e.g. for information processing, in a similar way as a field effect transistor, in that the first and second electrodes 3, 5 of the plasmon generator 2 provide the functionality of a transistor source and transistor drain and in that the modifier 37, in particular the combination of the gate electrode 35 and the third quantum system 33, provides the functionality of a transistor gate. The gate electrode 35 can, for example, be driven by low power and with a high bandwidth, for example in the range of 1 to 100 GHz.

In an alternative embodiment, the gate electrode 35 in the modifier 37 could be omitted. The charging of the third quantum state of the third quantum system 33 could then be induced by ionization caused by external radiation or by a nuclear process such as an alpha or beta decay. The plasmon generator 2 could then be used as a detector for such external radiation or nuclear process, since the charging of the third quantum state causes a change of the intensity of the plasmons generated by the plasmon generator 2 at the plasmon support surfaces 29, which can be detected.

In another alternative embodiment, the gate electrode 35 and the third quantum system 33 could be omitted. Instead, the modifier 37 could be equipped with a field generator for generating an electric field and/or a magnetic field to modify the energy level of the first quantum state of the first quantum system 13 directly. The modification of the energy level of the first quantum state affects the tunnel current between the first quantum system 13 and the second quantum system 15 and thus the intensity of the plasmons generated at the plasmon supporting surfaces 29 of the plasmon generator 2.

In a further alternative embodiment, the second quantum system 15 could be omitted. The tunnel current which is modified by the modifier 37 as explained above then flows from the first quantum system 3 directly to the second electrode 5. However, the advantage of the use of the second quantum system 15 is that it allows, as explained above with regard to FIGS. 1 and 2, for a better tunability of the frequencies of the generated plasmons.

A fifth embodiment of a plasmon generator 2a is described with regard to FIG. 6 which functions in essence in the same way as the plasmon generator 2 described above and which can in fact be regarded as a generalized design of the plasmon generator 2.

The plasmon generator 2a comprises a first quantum system 13 which defines at least a first quantum state and a contact 39. The first quantum system 13 and the contact 39 are present in an electric circuit 23 with a tunneling junction 25 between the first quantum system 13 and the contact 39. Electrons which tunnel between the first quantum state 13 and the contact 39 loose energy in the tunneling process and generate plasmons at a plasmon supporting surface (not shown) which may be placed proximate to the tunneling junction 25 and which may be adapted to guide the generated plasmons along one direction for a distinct distance, e.g., to a detector for plasmons.

The plasmon generator 2a comprises a modifier 37 adapted to modify the tunneling current through the tunneling junction 25 by changing the energy level of the first quantum state of the first quantum system and thus the intensity and/or frequency of the generated plasmons.

The first quantum system 13 of the plasmon generator 2a could for example be a nanotube or a quantum wire which can be wired to the voltage source 21 of the electric circuit. Thus, in contrast to the plasmon generator 2 of FIG. 5, a first electrode is not required. However, such a first electrode may also be associated with the first quantum system 13 of the plasmon generator 2a and may form part of the electric circuit 23.

Furthermore, the electric contact 39 may be defined by a second quantum system providing at least a second quantum state, a second electrode, or a second quantum system and an associated second electrode.

A sixth embodiment of a plasmon generator 2b is described with regard to FIG. 7 which functions in essence in the same way as the plasmon generators 2 and 2a described above. The plasmon generator 2b comprises a first electrode 3 which is formed by a gold substrate. A gold tip 41 of a scanning tunneling microscope (STM) forms a second electrode 5. A double tunneling barrier is arranged between the two electrodes 3, 5. The double tunneling barrier consists of a bilayer of $C_{60}$-molecules 43 and a vacuum barrier 45. A quantum system 13 consisting of a single Ir(ppy)$_3$-molecule is arranged on the surface of the bilayer of $C_{60}$-molecules 43 as shown in FIG. 7. The vacuum barrier 45 corresponds to a gap between the quantum system 13 and the gold tip 41. The gap is variable as the gold tip 41 can be moved up and down.

The gold tip 41 of the STM not only acts as an electrode but also as a modifier by which the tunneling current can be modified, in particular due to a change of the energy level of the quantum state of the quantum system 13.

The second electrode 5 formed by the gold tip 41 can be regarded as a drain contact and the first electrode 3 can be regarded as a source contact of a transistor. The gold tip 41 and the quantum system 13 can provide the functionality of a transistor gate. In particular, the effect of a separate gate electrode is mimicked by controlling the electric field E (=$E_{gate}$) between the gold tip 41 and the quantum system 13 via their spacing d (=$d_{vac}$).

The STM helps to precisely control the spacing d and to measure the current through the quantum system 13 and the tip 41 acts as an antenna which couples plasmons excited in the tunnel junction to emitted photons. The detection of these photons in the far field thus allows for probing the nanoscopic excitation of plasmons in the junction. In the following we refer to this radiation as plasmonic light emission.

An electric circuit 47 which is an equivalent to the experimental setup of FIG. 7 is shown on the right-hand side of FIG. 7. The electric circuit 47 includes a transistor 49 and the two tunnel barriers formed by the bilayer of $C_{60}$-molecules 43 and the vacuum barrier 45 are represented by resistors 51 and 53, respectively.

FIG. 8 shows the measured plasmonic light intensity P in kcounts per second=1000 counts/s as a function of the gate voltage $U_G$ and of the bias voltage $U_{bias}$ (see the electric circuit 47 on the right-hand side of FIG. 7).

The applied voltage U=$U_{bias}$ is the sum of the voltage drop over the vacuum (from tip 41 to quantum system 13) plus the voltage drop over the $C_{60}$ bilayer 43 (=$U_{C60}$). The gate electric field E ($E_{gate}$) generated between a gold tip 41 with sufficiently large curvature and the quantum system 13 can be approximated by E=(U−$U_{C60}$)/d, where d is the distance between the gold tip 41 and the quantum system 13.

Concerning the plasmon generator 2b of FIG. 7, measurements have shown that the energy level of the quantum system 13 which is used for plasmon generation is about 0.46 V above the Fermi level of the gold electrode 3.

The voltage drop across the $C_{60}$ bilayer is the gate voltage $U_G$ of this type of transistor 49. The gate voltage $U_G$ at which the transistor (see transistor 49 in FIG. 7) switches from off to on is equal to the energy of the quantum level of the quantum system (a switch to on means that plasmons are generated). Thus, at a gate voltage of $U_G$=0.46 V, plasmons are generated as can be seen in FIG. 8.

The switch-on condition for the generation of plasmons is exactly reached when the vacuum field in the tunnel junction is 2.5 V/nm. The maximum steepness (or slope) of plasmonic light emission as a function of field occurs for the smallest electric field change which is necessary to increase the emission by a factor of 10 (=1 decade). With regard to the electric field in the vacuum gap, this steepness of the amplification range was measured to be 11 mV/nm per decade.

For the device 2b of FIG. 7, $U_G$=$U_{C60}$=0.184 nm*$E_{vac}$ was determined where $E_{vac}$ is the given field in vacuum. With this formula the electric switching field of 2.5 V/nm can be transformed into the energy of the quantum system level:

2.5 V/nm*0.184 nm=0.46 V and the field sensitivity becomes:

11 mV/nm/decade*0.184 nm≈2 mV/decade.

A ratio between the on and off plasmonic intensity was measured to be at least three orders of magnitude. Thus, with respect to sensitivity a modulation of the applied gate voltage (see $U_G$ in the circuit 47 which corresponds to the voltage drop between the quantum system 13 and the electrode 3 closest to it) by 2 mV around a central gate voltage of 0.46 V induces a variation in the plasmonic light emission by one order of magnitude (see FIG. 8).

A switching time below 1 ns was demonstrated which allows applications at frequencies beyond 1 GHz. This frequency was reached by gating through the applied voltage ($U_{bias}$ in circuit 47). A direct switching of the transistor by the gate voltage $U_G$ through a superposed electric gate field localized inside the tunnel junction is expected to work at significantly higher clock rates. A limit is given by the rate at which the quantum system can be charged or decharged.

Furthermore, it was confirmed that the electronic levels of the quantum system 13 are influenced by the electrodes, since the metal work function has an effect on the energy levels of the quantum system. For example, replacing the gold electrode 3 by a silver electrode in the plasmon generator of FIG. 7 shifts the energy level used for plasmon generation of the Ir(ppy)$_3$ quantum system 13 about 0.3 eV closer to the Fermi energy and this allows to use a lower gate voltage.

The plasmon generator 2b therefore unites an electronic transistor and an electronic plasmon source supplied by moderate voltages of about 3 V, on the ultimate limit of a single molecule. Around a threshold vacuum field of 2.5 V/nm (corresponding to a gate voltage of 0.46 V), the plasmon emission can be controlled over three orders of magnitude by modulating the electric field over a range of 45 mV/nm (i.e. ±22.5 mV/nm). A maximum slope in the amplification range of 11 mV/nm/decade for the emission is achieved. The maximum clock rate for the plasmon modulation is higher than 1 GHz.

The described variants of plasmon generators in accordance with the present invention can be realized as a solid state device on an electronic chip and can be used to couple different parts of electric circuits by use of the generated plasmons. Furthermore, embodiments of plasmon generators in accordance with the present invention may be used as detectors for an external source of radiation or particles.

REFERENCE NUMERALS 1, 1a, 1b plasmon generator
2, 2a, 2b plasmon generator
3 first electrode
5 second electrode
7 first insulating layer
9 second insulating layer
11 third insulating layer
13 first quantum system 15 second quantum system
17 first quantum state
19 second quantum state
21 voltage source
23 electric circuit
25 tunneling junction
27 dashed lines (tunneling electron)
29 plasmon supporting surface
31 pairs of first and second quantum systems
33 third quantum system
35 gate electrode
37 modifier
39 contact
41 gold tip
43 bilayer
45 vacuum barrier
47 electric circuit
49 transistor
51, 53 resistor
V voltage

The invention claimed is:

1. A plasmon generator having a plasmon supporting surface (29) and first and second quantum systems (13, 15) respectively defining first and second quantum states (17, 19) with a tunneling junction (25) being present between the first and second quantum systems (13, 15), the first and second quantum systems (13, 15) being present in an electric circuit (23) to generate a tunneling current between the first and second quantum systems (13, 15), whereby electrons tunneling between said first and second quantum states (17, 19) lose energy in the tunneling process (27) and generate plasmons at the plasmon supporting surface (29) there being a first electrode (3) proximate to the first quantum system and a second electrode (5) proximate to the second quantum system, thereby providing a coupling between the respective quantum system and the electric circuit via the tunneling junction, wherein the plasmon supporting surface (29) is positioned proximate to at least one of the first quantum system (13), the second quantum system (15) and the tunnel junction (25), wherein each of the first and second quantum systems (13, 15) is any physical system with electronic states (17, 19) having at least substantially discrete energy levels, the electric circuit comprising a voltage source 21 having a voltage V adapted to cause a corresponding energy difference between a respective Fermi energy ($E_{Fermi}$) of the first electrode (3) and a respective Fermi energy ($E_{Fermi}$) of the second electrode (5).

2. A plasmon generator in accordance with claim 1, wherein at least one of the first and second electrodes (3, 5) defines the plasmon supporting surface (29).

3. A plasmon generator in accordance with claim 1, wherein one or each of the first and second quantum systems (13, 15) is any physical system with electronic states (17, 19) having at least substantially discrete energy levels and being at least one of an atom, a molecule, a quantum dot, a quantum wire, a nanotube and a semiconducting structure.

4. A plasmon generator in accordance with claim 1, wherein there are a plurality of first quantum systems (13) and a plurality of second systems (15) and a plurality of tunneling junctions (25) in said electric circuit (23).

5. A plasmon generator in accordance with claim 1, wherein at least one of the first and second quantum systems (13, 15) has a plurality of at least substantially discrete quantum states (17, 19).

6. A plasmon generator in accordance with claim 1, there being a modifier (37) for modifying the tunneling current by changing the energy level of at least one quantum state (17, 19).

7. A plasmon generator in accordance with claim 6, wherein the modifier comprises at least one of an electric field generator, a magnetic field generator, a third quantum system associated with an electrode disposed proximate to one of the first and second quantum systems, and an external source of radiation or particles causing an electric or magnetic field at the location of the first or second quantum systems and/or ionization.

8. A plasmon generator in accordance with claim 6, wherein the modifier (37) comprises a third quantum system (33) disposed proximate to one of the first and second quantum systems (13, 15) and an electric field generator (35), to modify the energy level of a third quantum state defined by the third quantum system (33).

9. A plasmon generator having
a plasmon supporting surface (29),
a quantum system (13) defining at least one quantum state (17), a first contact (3) to the quantum system (13) and a second contact (39, 41) to the quantum system (13),
the quantum system (13) and the second contact (39, 41) being present in an electric circuit (23) with a tunneling junction (25, 45) being present between the quantum system (13) and the second contact (39, 41) for generating a tunneling current between the quantum system (13) and the second contact (39, 41), whereby electrons tunneling between said second contact (39, 41) and said quantum state (17) lose energy in the tunneling process (27) and generate plasmons at the plasmon supporting surface (29),
there being at least one of a modifier (37), and a control for the electric field strength inside the tunnel junction, for modifying the tunneling current by changing the energy level of the quantum state (17) wherein the plasmon supporting surface (29) is positioned proximate to the quantum system (13), and the tunnel junction (25), wherein the quantum system (13) is any physical system with an electronic state having an at least substantially discrete energy level, the electric circuit comprising a voltage source (21) having a voltage V adapted to cause a corresponding energy difference between a respective Fermi energy ($E_{Fermi}$) of the first contact (3) of the quantum system (13) and an energy level provided by the second contact (39).

10. A plasmon generator in accordance with claim 1, wherein at least one of the first and second electrodes (3, 5) defines the plasmon supporting surface (29).

11. A plasmon generator in accordance with claim 9, wherein the modifier (37) is user-controllable.

12. A plasmon generator in accordance with claim 9, wherein the modifier (37) comprises at least one of an electric field generator (35), a magnetic field generator, a third quantum system (33) associated with an electrode disposed proximate to the first quantum system (13), and an external source of radiation or particles causing an electric or magnetic field at the location of the first or third quantum system (13, 33) and/or ionization.

13. A plasmon generator in accordance with claim 9, wherein the modifier (37) comprises a third quantum system (33) and an electric field generator.

14. A plasmon generator in accordance with claim 2, wherein the first and the second electrodes (3, 5) define a plasmon supporting waveguide.

15. A plasmon generator in accordance with claim 8, wherein the electric field generator is a gate electrode (35).

16. A plasmon generator in accordance with claim 9, wherein the control comprises a control for the spatial position of a tip electrode (5, 41) relative to the quantum system (13).

17. A plasmon generator in accordance with claim 9, wherein the quantum system (13) is one of an atom, a molecule, a quantum dot, a quantum wire, a nanotube and a semiconductor structure.

18. A plasmon generator in accordance with claim 1, wherein each of the first and second quantum systems (13, 15) has a discrete energy levels that differs from the Fermi level of the respectively associated first and second electrodes (3, 5) by an amount less than 1 eV.

19. A plasmon generator in accordance with claim 1, wherein the plasmon supporting surface comprises least one of a silver wire and a gold wire.

20. A plasmon generator in accordance with claim 1, wherein at least one of the first and second electrodes has a thickness in the nanometer range.

21. A plasmon generator in accordance with claim 1, wherein the distance between each quantum system and the associated electrode is in the nanometer range.

22. A plasmon generator in accordance with claim 21, wherein the distance between each quantum system and the associated electrode is in the range between 0.1 and 5 nm.

23. A plasmon generator in accordance with claim 21, wherein the distance between each quantum system and the associated electrode is in the range between 0.5 and 2 nm.

24. A plasmon generator in accordance with claim 9, wherein the corresponding energy difference between the Fermi energy ($E_{Fermi}$) of the first contact (3) and a discrete state (17) of the first quantum system (13) differ by an amount less than 1 eV.

* * * * *